(12) United States Patent
Buschel et al.

(10) Patent No.: US 8,638,564 B2
(45) Date of Patent: Jan. 28, 2014

(54) DYE-BASED CIRCUIT MOUNT TESTING

(75) Inventors: Daniel J Buschel, Poughkeepsie, NY (US); Wai M Ma, Poughkeepsie, NY (US); Donald A Merte, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 13/233,748

(22) Filed: Sep. 15, 2011

(65) Prior Publication Data

US 2013/0070434 A1    Mar. 21, 2013

(51) Int. Cl.
*H05K 1/14* (2006.01)
(52) U.S. Cl.
USPC .......................................... 361/757; 427/96.1
(58) Field of Classification Search
USPC .................... 361/752, 757; 427/96.1, 99.2
See application file for complete search history.

(56) References Cited

U.S. PATENT DOCUMENTS

| | | |
|---|---|---|
| 5,115,136 A | 5/1992 | Tomasch |
| 5,651,493 A | 7/1997 | Bielick et al. |
| 6,117,352 A * | 9/2000 | Weaver et al. ................ 216/105 |
| 6,117,695 A * | 9/2000 | Murphy et al. ................. 438/15 |
| 6,342,400 B1 | 1/2002 | DePetrillo |
| 6,556,298 B1 | 4/2003 | Pailliotet |
| 7,086,291 B2 | 8/2006 | Holung et al. |

FOREIGN PATENT DOCUMENTS

GB    2317959    11/2000

OTHER PUBLICATIONS

Materials for Luminescence Flaw Detection (LFD), 10 pages.

\* cited by examiner

*Primary Examiner* — Bernard Rojas
(74) *Attorney, Agent, or Firm* — Kunzler Law Group, PC

(57) ABSTRACT

An apparatus may include a housing forming an enclosure having an edge seatable on a printed circuit board (PCB). The enclosure edge may include an edge portion. The housing may be configured to transfer a force applied to the housing to a surface mount component mounted on the PCB to dismount the surface mount component. The apparatus may include a dye inlet formed by the housing and configured to conduct a dye into the enclosure. Another apparatus may include at least one gasket mounted to the enclosure edge to contact the major surface of the PCB adjacent to the surface mount component for forming a seal with the PCB. A method may include enclosing a surface mount component in an enclosure formed in a nozzle apparatus, introducing a dye into the enclosure, and applying a force to the nozzle apparatus to dismount the surface mount component.

20 Claims, 5 Drawing Sheets

DYE-BASED CIRCUIT MOUNT TESTING

BACKGROUND

The present inventions relate to testing interconnections, such as solder joints, to detect defects that may negatively affect the integrity of a joint, and more specifically to dye-based circuit mount testing of solder joints that connect packaged semiconductors to a printed circuit board (PCB) or other substrate.

A semiconductor package assembly, also called a package, is a carrier for one or more integrated circuits. A package may provide leads, pins, and/or other structures to permit electrical, electronic, and/or mechanical interconnections between the packaged integrated circuit and the supporting PCB or other substrate. A surface-mount component (SMC) is a type of package that may be mounted directly to the surface of a substrate, for example, by soldering its leads and/or pins to the PCB. A ball-grid array (BGA) is a type of SMC that replaces the leads and pins with a grid of solder balls placed on the bottom of the package and held in place, for example, by a flux until soldered. BGA packaging enables a high density of solder-joint connections between the package and the substrate. However, a solder-joint connection may exhibit defects, such as cracks, separations, and/or voids, that may negatively affect the electrical, electronic, and/or mechanical properties of the joint.

BRIEF SUMMARY

According to one embodiment, an apparatus may include a housing forming an enclosure having an edge seatable on a major surface of a printed circuit board. The enclosure edge may include an edge portion configured to be positioned adjacent to at least a portion of a perimeter of a surface mount component that is mounted on the major surface of the printed circuit board and received in the enclosure. The housing may be configured to transfer a force to the surface mount component when the force is applied to the housing appropriate to press the edge portion against the portion of the perimeter of the surface mount component, whereby the surface mount component is dismounted from the printed circuit board when a sufficient such force is applied. The apparatus may additionally include a dye inlet formed by the housing and configured to conduct a dye into the enclosure, and thereby onto the surface mount component when the housing edge is seated on the major surface of the printed circuit board with the surface mount component positioned within the enclosure.

According to another embodiment, an apparatus may include a housing forming an enclosure having an edge seatable on a major surface of a printed circuit board. The enclosure edge may include an edge portion configured to be positioned adjacent to at least a portion of a perimeter of a surface mount component that is mounted on the major surface of the printed circuit board and received in the enclosure. The housing may be configured to transfer a force to the surface mount component when the force is applied to the housing appropriate to press the edge portion against the portion of the perimeter of the surface mount component, whereby the surface mount component is dismounted from the printed circuit board when a sufficient such force is applied. The apparatus may additionally include at least one gasket mounted to the enclosure edge to contact the major surface of the printed circuit board adjacent to the surface mount component such that a seal is formed when the gasket is pressed against the major surface of the printed circuit board.

According to a further embodiment, a method may include enclosing a surface mount component mounted on a major surface of a printed circuit board via a nozzle apparatus. The nozzle apparatus may define an enclosure with an opening, the surface mount component being received within the enclosure. The method may additionally include introducing a dye into the enclosure through a passage in the nozzle apparatus to apply the dye to the surface mount component while the surface mount component is enclosed. The method may further include applying a force to the nozzle apparatus in a direction parallel to the major surface of the printed circuit board while the surface mount component is enclosed, the force being sufficient to move the nozzle apparatus against the surface mount component and dismount the surface mount component from the printed circuit board.

DETAILED DESCRIPTION

Figure 1:
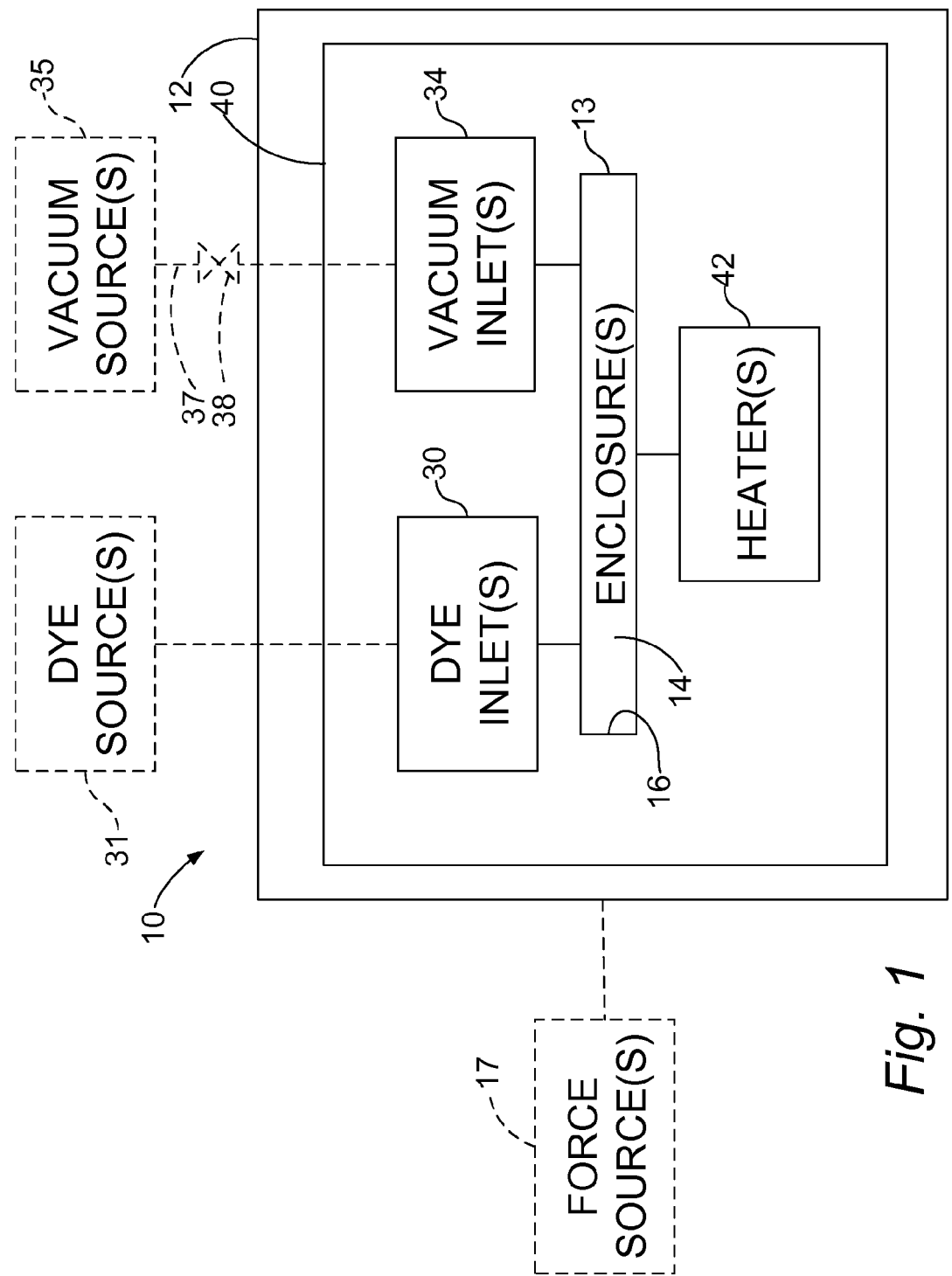
FIG. 1 is a block diagram of an illustrative embodiment of a nozzle apparatus.

Referring to FIG. 1, an illustrative embodiment of a nozzle apparatus 10 is depicted. Nozzle apparatus 10 may include a housing 12 with one or more surfaces 13. Surfaces 13 may form at least one enclosure 14 having an enclosure edge 16. The enclosure may be sized to receive a surface mount component that is mounted on a major surface of a printed circuit board. Housing 12 may be configured to transfer a force from one or more force sources 17 to the surface mount component when the force is applied to the housing appropriate to press enclosure edge against a portion of a perimeter of the surface mount component, The surface mount component may be dismounted from the printed circuit board when a sufficient such force is applied.

The nozzle apparatus may additionally include at least one dye inlet 30, at least one vacuum inlet 34, at least one seal 40, and/or one or more heaters 42. The dye inlet may be formed by (or mounted to) housing 12 and configured to conduct a dye from one or more dye sources 31 into enclosure 14. Seal 40 may be mounted to enclosure edge 16 to form a substantially gas-tight seal when seal 40 is pressed against a surface, such as a major surface of a printed circuit board (PCB). Vacuum inlet 34 may be formed by (or mounted to) housing 12 and configured to be connected to one or more vacuum sources 35 to draw a vacuum in the enclosure. Heaters 42 may be mounted to the housing and configured to heat the enclosure. Although nozzle apparatus 10 is shown to include housing 12, dye inlet 30, vacuum inlet 34, seal 40, and heater 42, different embodiments of nozzle apparatus 10 may include different combinations of components, such as the housing and the dye inlet or the housing and the seal.

Figure 2:
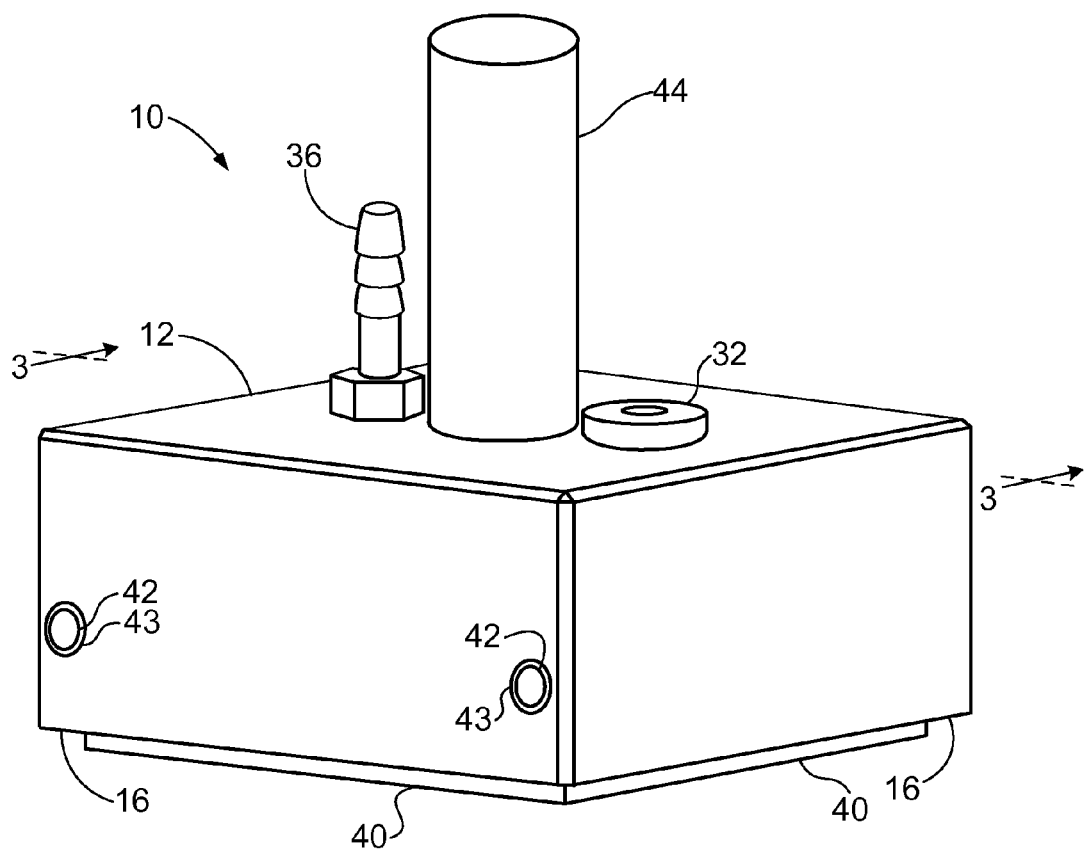
FIG. 2 is an isometric view of an illustrative embodiment of the nozzle apparatus of FIG. 1.
Figure 3:
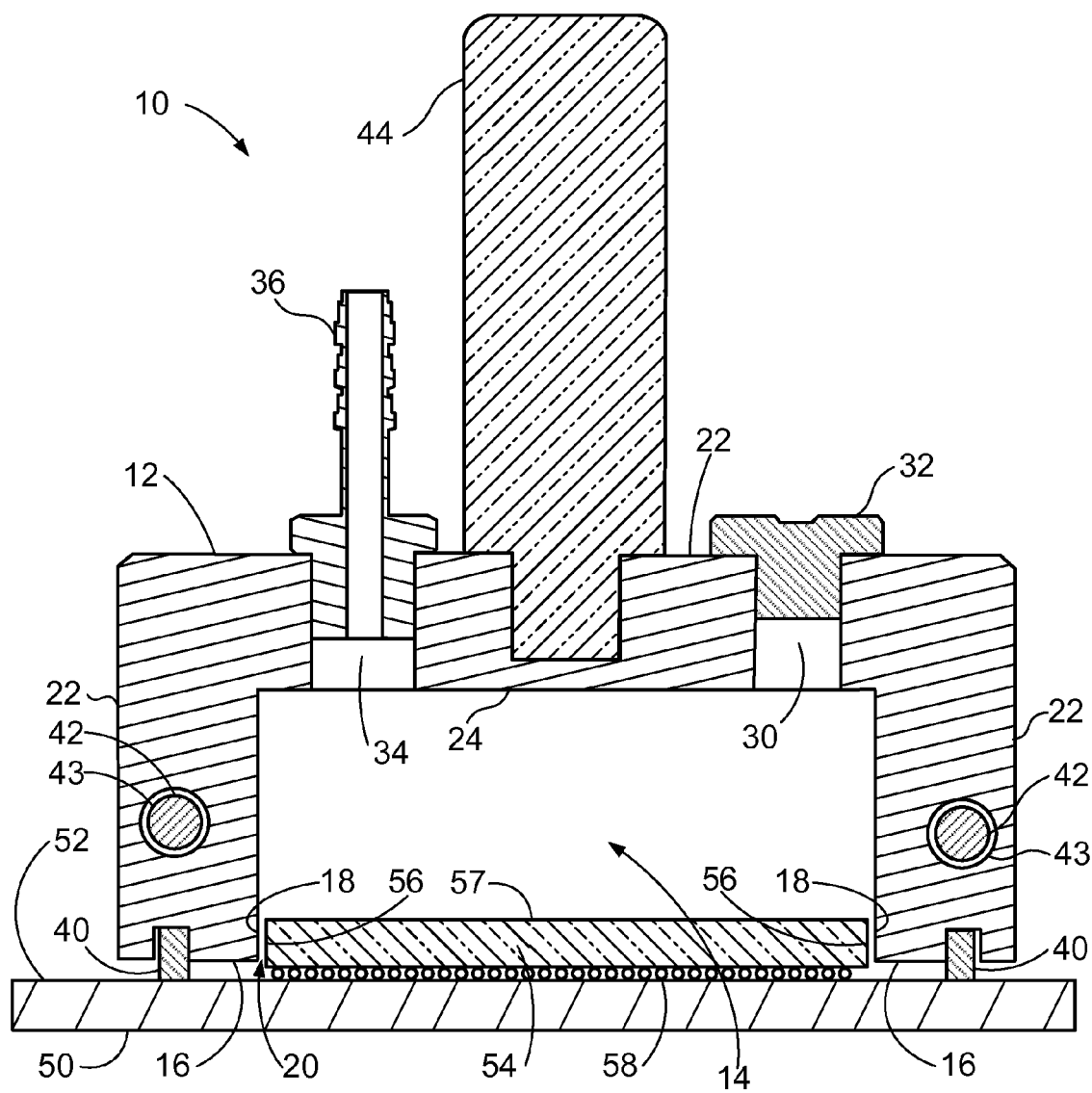
FIG. 3 is a sectional view of the nozzle apparatus of FIG. 2 taken along lines 3-3 in FIG. 2, shown with a surface mount component of a PCB received within an enclosure of the nozzle apparatus.

Referring to FIGS. 2-3, an example of nozzle apparatus 10 is illustrated. Housing 12 may generally be a rigid or partially rigid structure that forms enclosure 14. Enclosure 14 may be an interior volume within housing 12 defined by, for example, walls 22 or other interior surface of housing 12. Walls 22 of housing 12 may terminate to form an enclosure edge 16 configured to conform to and seat against a predetermined surface. For example, to seat against a generally planar surface, enclosure edge 16 may have a corresponding generally planar profile at the edge or surface adjacent to the planar surface. Enclosure edge 16 may define an open end or side 20 of enclosure 14, where the internal perimeter at opening 20 may include an edge portion 18 of wall 22 configured to be positioned adjacent to at least a portion of the perimeter of a predetermined object received within enclosure 14 through opening 20. By means of edge portion 18 positioned adjacent to the perimeter of a received object, nozzle apparatus 10 may transfer a force applied to housing 12 to the received object.

For example, housing 12 may be configured to seat against a major surface 52 of a PCB 50, and enclosure edge 16 may be configured to receive a surface-mount component (SMC) 54 that is mounted on surface 52. "Surface-mount component" or "SMC" herein includes semiconductor packages, such as a ball-grid-array (BGA). "Surface mount component" or "SMC" herein also may include other components of interest, such as electrical, electronic, or mechanical components, made from materials such as metal, ceramic, and/or plastic that are subject to surface-breaking defects potentially detectable through dye-penetrant inspection, the potential defects occurring on the component itself and/or on its attachment means, such as its soldered connections.

At least a portion of a received SMC 54 may pass within (or is received by) enclosure 14, thereby positioning at least a portion of perimeter 56 of SMC 54 adjacent to edge portion 18. Applying a force to housing 12 directed parallel to surface 52 of PCB 50 may press edge portion 18 against at least a portion of perimeter 56 of SMC 54, thereby transferring the force from housing 12 to SMC 54. By applying a sufficient force, SMC 54 may be dismounted and/or sheared from PCB 50.

Edge portion 16 may be configured such that, when SMC 54 is received within enclosure 14, the edge portion is adjacent to the entire perimeter, in contrast to only a portion of the perimeter, of a predetermined object. For example, edge portion 16 may be sized and shaped to fit over the entire perimeter 18 of a particular type of SMC 54 of a known size and shape. If the perimeter of SMC 54 is, for example, one inch on each side so that SMC 54 covers about one square inch of major surface 52 of PCB 50, then edge portion 16 may have a matching interior perimeter one inch (plus a tolerance) on each side. The tolerance may be a mechanical clearance added to the interior perimeter to allow SMC 54 to be received within enclosure 14 without significant binding or interference. The size and shape of the mouth of enclosure 14 defined by edge portion 18 may be selected to mate with those of SMC 54 and/or other object(s) being tested, so that the perimeters of edge portion 18 and SMC 54 have a complimentary or part-counterpart relationship (with allowance for clearance). This complimentary relationship may exist even if SMC 54 or other received object has an oval, circular, polygonal, irregular, and/or other non-square and/or non-rectangular perimeter.

When mounted to a PCB, an SMC stands in relief perpendicular to (or extend perpendicularly from) the major surface of the PCB. For example, if SMC 54 is a ball-grid array (BGA) soldered to a PCB, then the top side of the BGA (i.e., the side opposite a solder-ball array 58) may stand in relief (or extend or be spaced) from the surface of the PCB, where the relief distance or height is the sum of the thickness of the BGA package, the thickness of the solder-ball grid, and any other separations and tolerances. When housing 12 slips over SMC 54, all or part of its relief height is received inside or within enclosure 14. The enclosure may be configured to accommodate the relief height, such as by allowing an adequate separation between an interior roof 24 of enclosure 14 and a top side 57 of SMC 54 so that top side 57 does not interfere with the interior opening of dye inlet 30, vacuum inlet 34, and/or other passages and/or components of nozzle apparatus 10.

Housing 12 may provide mechanical support for attached parts of apparatus 10, and its form defines negative spaces, such as enclosure 14 and passages (such as dye inlet 30). Housing 12 may be cast, formed, assembled, and/or otherwise fabricated from suitable rigid material(s). The material(s) used for housing 12 may have sufficient mechanical strength and/or impermeability to maintain a pressure difference, such as at least a partial vacuum within enclosure 14; sufficient mechanical strength to shear off and/or otherwise dismount SMC 54 from PCB 50; adequate resistance to corrosion, dissolution, and/or other detrimental physical and/or chemical interaction with fluids used during use; and/or sufficient thermal conductivity to allow heater 42 to increase the temperature of enclosure 14. Metals, such as aluminum or its alloys, may possess suitable characteristics for fabricating housing 12, and facilitate fabrication of holes, passages, threads, and/or other structures. However, other metals, alloys, plastics, and/or other generally rigid materials may possess appropriate properties for fabricating all or part of housing 12. Although housing 12 may be machined from, for example, a single block of an aluminum alloy, it may alternatively be assembled from parts fabricated from other or different materials selected for their respective functional purposes.

Housing 12 may include at least one dye inlet 30, which may be a passage through a wall 22 of housing 12 configured to conduct a dye and/or other fluid(s) into enclosure 14. The term "dye" herein may include indicator fluids, developers, solvents, colorants, such as dyestuffs, stains, and pigments that may be dissolved, suspended, and/or otherwise conducted by a carrier fluid, and/or other fluids. The term may additionally refer to a substance detectable by any means, such as to inspection under visible or ultraviolet light.

Dye inlet 30 may be fabricated by, for example, drilling a hole through a wall 22, thereby establishing a passage for fluid communication from an external dye source to enclosure 14. Dye inlet 30 may enable the application of dye or other fluid to SMC 54 when enclosure edge 16 is seated on surface 52 of PCB 50 with SMC 54 positioned within the enclosure 14. For example, when nozzle apparatus 10 is used for dye-penetrant inspection, a fluid applied to SMC 54 via inlet 30 may include a dye, such as machinist's layout fluid; or it may include a developer, such as those used for visible or florescent dyes; or it may include cleaners, such as solvents that remove excess indicator fluids and/or developers from the surface of the article under test, such as an SMC 54; or it may include a series or combination of fluids.

Dye inlet 30 may be used to introduce a dye and/or indicator fluid(s) from one or more dye sources into enclosure 14 by, for example, pouring the dye into the open dye inlet 30 (possibly aided by a funnel and/or similar device(s)). A dye may be introduced through inlet 30 by means of a hose or tube inserted into inlet 30. Optionally, a dye fitting, not shown, that fits sealingly into dye inlet 30 may be used, to which a hose or tube may be connected. Dye inlet 30 may be a hole with a diameter selected to match the outer diameter of the hose or tube, which may be held in place within dye inlet 30 by friction, sealant, adhesive, threads, and/or other means. Attaching the other end of the hose or tube to dye source(s) 31 (shown in FIG. 1) may enable an ongoing supply of dye through inlet 30.

Nozzle apparatus 10 may additionally, or alternatively, include a removable dye inlet cap 32, which may be applied to dye inlet 30 to create a substantially gas-tight closure for the dye inlet and allow enclosure 14 to hold pressure and/or maintain a vacuum. When installed on or in inlet 30, cap 22 may be held in place by friction, sealant, threads, and/or other means. Removing cap 32 may permit the application of a dye via dye inlet 30.

Although FIGS. 2-3 show an example nozzle apparatus 10 in which dye inlet 30 passes through a particular wall 22 of housing 12, inlet 30 may alternatively, or additionally, pass through any wall(s) 22 of housing 12. Additionally, although FIGS. 2-3 show an example nozzle apparatus with a single inlet 30, other embodiments may have multiple inlets 30. For example, a nozzle apparatus 10 used for a procedure that employs more than one fluid, for instance at different stages of a test, may include a distinct inlet 30 for each distinct fluid, where each inlet 30 may have its own source of supply and/or suitable means of closure.

Nozzle apparatus 10 may additionally, or alternatively, include at least one seal 40, such as a gasket, mounted on enclosure edge 16. The seal may be positioned to contact surface 52 of PCB 50 and surrounding opening 20 of enclosure 14. Compressing seal 40 against surface 52 of PCB 50 and/or other substrate may establish a substantially gas-tight seal between housing 12 and PCB 50, for example to allow enclosure 14 to hold a pressure difference long enough to conduct a testing procedure. When all openings of housing 12 are sealed by gaskets, caps, and/or other suitable means, enclosure 14 may function as a vacuum or pressure chamber, with PCB 50 in effect acting as a wall of enclosure 14.

Seal 40 may be formed from a pliable and potentially replaceable material or member. Seal 40 may be affixed to enclosure edge 16 by setting it in a groove cut into enclosure edge 16, by a sealant, an adhesive, and/or other suitable means. Because seal 40 may be exposed to heat and/or to fluids, such as those used for dye-penetrant testing, seal 40 may be fabricated from a material selected for resistance to heat and to corrosion by those fluids. The nozzle apparatus may, in some embodiments, include multiple seals, such as multiple gaskets mounted concentrically on enclosure edge 18.

Housing 12 may additionally, or alternatively, include at least one vacuum inlet 34, which may be a passage through a wall 22 of housing 12 configured to allow the attachment of vacuum source(s) 35 (shown in FIG. 1) and the creation of a vacuum within enclosure 14. Vacuum inlet 34 may be fabricated by, for example, drilling a hole through wall 22, thereby establishing a passage in fluid communication with enclosure 14. Vacuum inlet 34 may enable the removal (or addition) of a gas, such as atmospheric air from (or to) enclosure 14, and therefore may enable the creation and maintenance of reduced (or increased) pressure.

Vacuum inlet 34 may support the direct or indirect connection of a vacuum or pressure source to apparatus 12. For example, vacuum inlet 34 may be a hole with a diameter selected to match the outer diameter of a vacuum hose or tube, which may be inserted into inlet 34 and held in place there by friction, sealant, adhesive, threads, or other suitable means. For example, a tube 37 (shown in FIG. 1) may be held in place by helical threads cut into the inserted end of the tube and into inlet 34, permitting attachment in the manner of a bolt and nut. Attaching the other end of the hose or tube to vacuum source 35, such as a vacuum pump, may enable the creation of a vacuum inside enclosure 14. In such examples, a valve 38 spliced into hose or tube 37 may act as a substantially gas-tight closure for inlet 34, allowing inlet 34 to be sealed when desired.

Nozzle apparatus 10 may additionally, or alternatively, include a vacuum fitting 36, such as a barb-type vacuum fitting, mounted to vacuum inlet 34. Fitting 36 may be held in place by friction, sealant, adhesive, threads, suction, and/or other suitable means to maintain a substantially gas-tight seal between inlet 34 and fitting 36. Fitting 36 may expedite the attachment of a vacuum or pressure source to apparatus 10, for example, by slipping a vacuum hose over the barbed end of a barbed vacuum fitting. A valve anywhere in line between the vacuum source and enclosure 14 may act as a closure for inlet 34 and for enclosure 14.

Although FIGS. 2-3 show a vacuum inlet 14 that passes through a particular wall 22 of housing 12, inlet 34 may alternatively, or additionally, pass through any wall(s) 22 of housing 12. Additionally, although FIGS. 2-3 show a nozzle apparatus 10 with a single vacuum inlet 34, other embodiments may have multiple vacuum inlets 34.

Nozzle apparatus 10 may additionally, or alternatively, include one or more heaters 42 positioned to transfer heat to enclosure 14 and therefore to an article under test, such as SMC 54. A heater 42 may be, for example, a cartridge-type heater, which may be a rod-shaped electrical heater suitable for insertion into a hole drilled in a wall 22 of housing 12. One or more holes 43 for heater(s) 42 may be drilled parallel to the plane defined by enclosure edge 16 or otherwise disposed in a wall 22 of housing 12. A heater 42 may be mounted outside housing 12 or within enclosure 14. Multiple heaters 42 may be provided. Although nozzle apparatus 10 is shown to include two heaters 42, the nozzle apparatus may include any suitable number of heaters, such as one, three, four or more heaters. Other heat sources may also be used, such as a heated fluid that is disposed in or travels through passageways in the housing.

Nozzle apparatus 10 may additionally, or alternatively, include at least one suitably shaped handle 44 attached to housing 12. Handle 44 may expedite manipulation of nozzle apparatus 10 by its operator and/or by other testing or production equipment. Handle 44 may be fabricated from, for example, aluminum, its alloys, and/or from other metals, solids, and/or rigid materials. Because some procedures performed by apparatus 10 may involve heating enclosure 14, the material used for handle 44 may be selected as a heat conductor and/or insulator.

Handle 44 may be attached to any wall 22 of housing 12 by various suitable means. For example, the handle may be attached by matched threads cut into handle 44 and into a hole provided for the handle in housing 12, which may expedite removal of the handle when appropriate. Handle 44 may be used to apply force to housing 12, such as a force directed perpendicular to PCB 50, by gripping handle 44 in a chuck attached to a press. Force applied in that direction may serve to compress seal 40 to form a substantially gas-tight seal against PCB 50. Handle 44 may be used to apply force directed parallel to major surface 52 of PCB 50, for example, to apply a shearing force to SMC 54 by pressing edge portion 18 of housing 12 against perimeter 56 of SMC 54.

Figure 4:
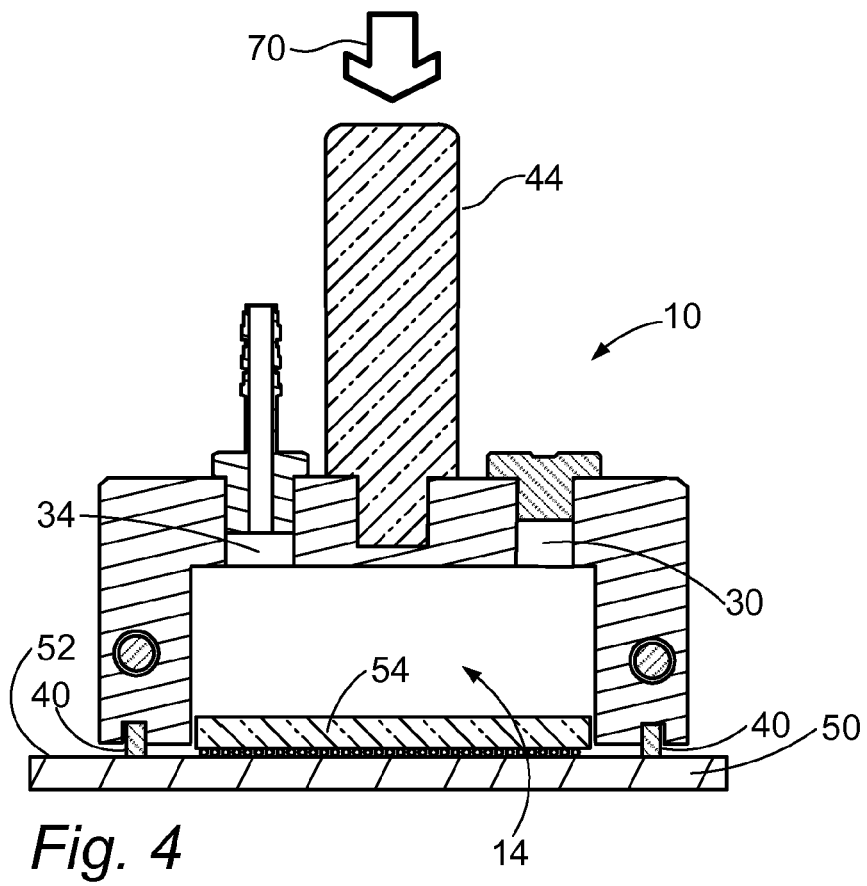
FIG. 4 is the nozzle apparatus of FIG. 3, showing application of a sealing force on the nozzle apparatus.
Figure 5:
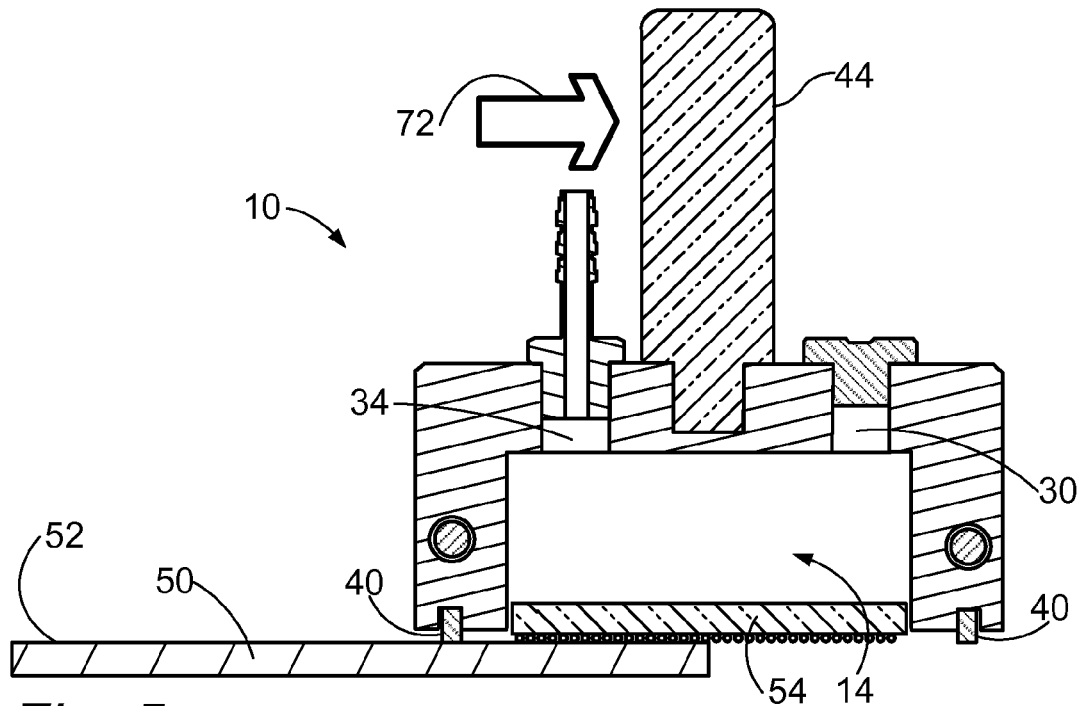
FIG. 5 is the nozzle apparatus of FIG. 3, showing dismounting of the surface mount component of FIG. 3 via application of a shearing force on the nozzle apparatus.

Referring to FIGS. 4-5, the application of various forces on nozzle apparatus 10 is illustrated. A sealing force 70 perpendicular to major surface 52 of PCB 50 may be applied to nozzle apparatus 10, such as to handle 44 and/or other suitable portions of nozzle apparatus 10. The sealing force may compress seal 40 to aid in the formation of a substantially gas-tight seal. A vacuum may then be created in the enclosure by connecting vacuum inlet 34 to a vacuum force. Additionally, a shearing force 72 may be applied to nozzle apparatus 10 parallel to major surface 52 of PCB 50 sufficient to dismount or dislodge SMC 54 from the major surface. The sealing and/or shearing forces may be applied from one or more forces sources 17 (shown in FIG. 1), which may include a user, a press, and/or other suitable sources of force.

Figure 6:
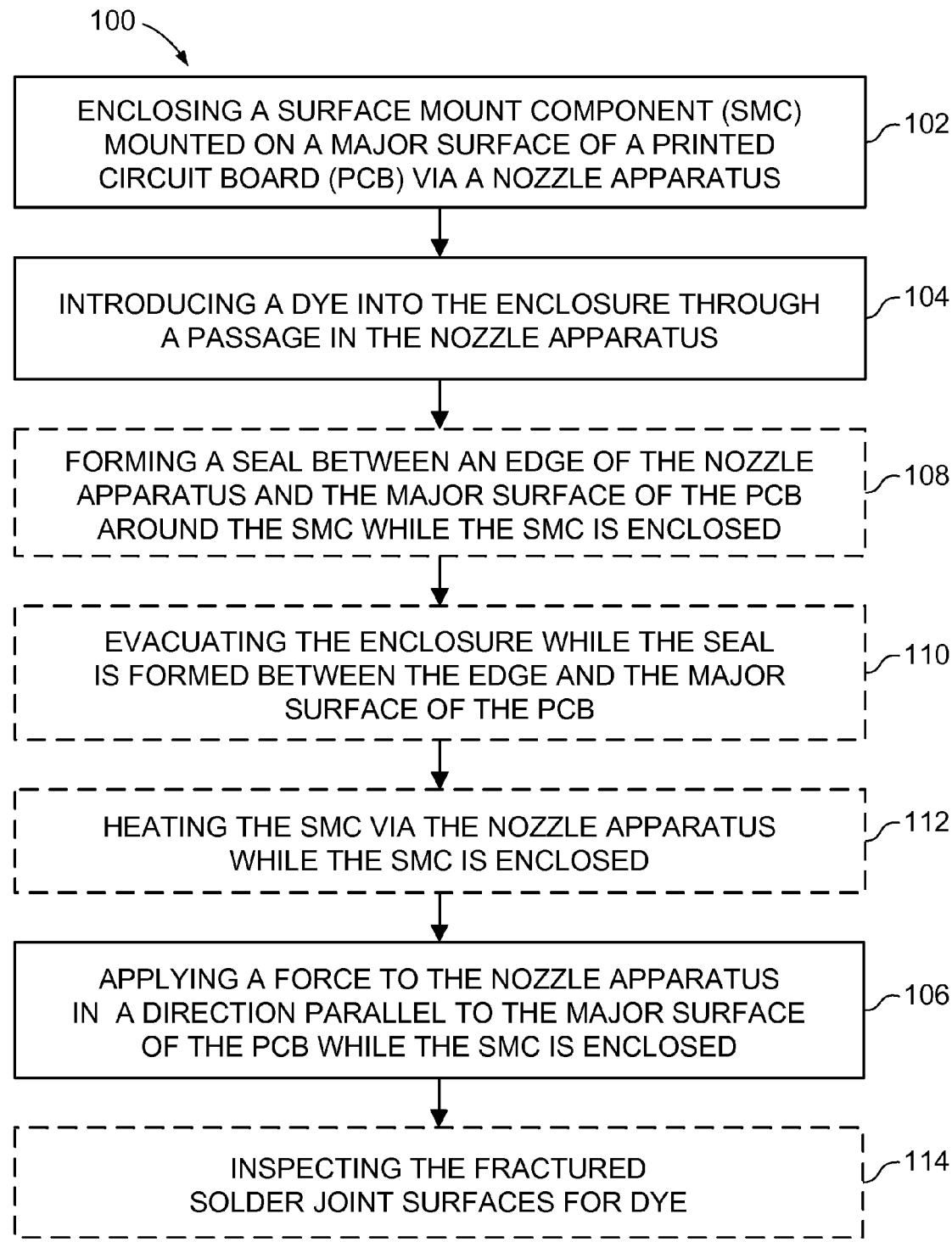
FIG. 6 is a flow-chart showing an illustrative embodiment of a method of testing solder joint integrity of a surface mount component.

Referring to FIG. 6, an example of a method 100 of testing solder joint integrity of a surface mount component is depicted. While FIG. 6 shows illustrative steps of a method according to one embodiment, other embodiments may omit, add to, and/or modify any of the steps shown in that figure. The method may include enclosing an SMC 54 mounted on a major surface 52 of a PCB 50 via nozzle apparatus 10, at 102; introducing a dye into the enclosure 14 through a passage in the nozzle apparatus, at 104; and/or applying a force to nozzle apparatus 10 directed parallel to surface 52 sufficient to move the apparatus against SMC 54 and dismount SMC 54 from PCB 50, at 106.

Enclosing a SMC 54 may include positioning nozzle apparatus 10 adjacent to SMC 54, so that the perimeter of SMC 54 aligns with the perimeter of opening 20 of enclosure 14, then slipping apparatus 10 over SMC 54 so that some or all of the relief height of SMC 54 passes into enclosure 14 through opening 20. When SMC 54 is received inside enclosure 14, at least a portion of the perimeter 56 of SMC 54 may be adjacent to at least a portion of edge portion 18 of enclosure 14. Opening 20 may be configured to fit relatively tightly over the perimeter of SMC 54; or opening 20 may be larger than the perimeter of SMC 54 in one or more directions, leaving a space between enclosure edge 16 and SMC perimeter 56 on one or more sides.

Enclosing SMC 54 may include enclosing the entire perimeter of SMC 54. Additionally, introducing a dye into enclosure 14 may include pouring or adding a dye fluid through the open dye inlet 30. Because inlet 30 is in fluid communication with enclosure 14, the dye may flow into enclosure 14 and consequently flow onto the SMC 54. Nozzle apparatus 10 may allow the application of a dye to SMC 54 during the time that SMC 54 is inside (or received or positioned within) enclosure 14. Introducing a dye into the enclosure may occur prior to applying a force to the apparatus.

Applying a force to the apparatus may including pushing or pulling housing 12 parallel to surface 52 of PCB 50 while SMC 54 is enclosed by enclosure 14. This shearing force may be applied directly or indirectly to housing 12, for example via handle 44. The shearing force may be applied by hand or by a machine, such as a press. Nozzle apparatus 10 may initially move across surface 52 in the direction of the force until at least a portion of edge portion 18 of enclosure 14 makes contact with at least a portion of perimeter 56 of enclosed SMC 54. After contact occurs, the substantially rigid structure of housing 12 may transfer the shearing force to SMC 54. An initial parallel alignment of the contacting sides of enclosure 14 with the corresponding sides of SMC 54 may assist in assuring broad initial contact between edge portion 18 and perimeter 56. Sufficient force may be applied to dismount or shear SMC 54 away from PCB 50, for example, to allow inspection of ball-grid array solder joints for defects exposed by a penetrant dye.

Method 100 may additionally, or alternatively, include forming a seal between enclosure edge 16 of nozzle apparatus 10 and surface 52 of PCB 50, at 108. The seal may be formed around SMC 54 while the SMC is enclosed by enclosure 14. Forming a seal may include applying a force to nozzle apparatus 10 perpendicular to surface 52, in effect pressing the nozzle apparatus against PCB 50. In an embodiment of nozzle apparatus 10 that has a seal 30, the force may compress seal 30 to aid the formation of a substantially gas-tight seal. The force may be applied by hand, weights applied to housing 12, and/or a machine (such as a press). Sealing enclosure 14 at enclosure edge 16 and/or seal 40, together with sealing other openings (such as dye inlet 30) may subsequently permit the creation of a pressure difference such as a vacuum within enclosure 14. The seal may be formed, for example, before, during, and/or after introducing a dye.

Method 100 may additionally, or alternatively, include evacuating enclosure 14 while the seal is formed between seal 40 and surface 52 of PCB 50, at 110. Evacuating enclosure 14 may include connecting a vacuum source, such as a vacuum pump, to vacuum inlet 34 (such as via fitting 36), and then reducing the pressure inside enclosure 14 relative to ambient pressure. The presence of a vacuum may help draw penetrant dyes into surface defects through capillary action. Drawing a vacuum within enclosure 14 while it is seated and sealed on surface 52 may eliminate the need to cut a section out of a PCB prior to inspection, so that the section is small enough to fit in a vacuum chamber. Evacuating the enclosure may occur after introducing a dye.

Method 100 may additionally, or alternatively, include heating SMC 54 via one or more heaters 42 while SMC 54 is enclosed in enclosure 14, at 112. The heating may occur after introducing a dye. During dye-penetrant testing, for example, baking SMC 54 after applying the dye may help harden the dye. Method 100 may additionally, or alternatively, include inspecting the fractured joint surfaces of SMC 54 for dye, such as after the SMC has been dismounted by application of the shearing force via the nozzle apparatus, at 114.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:

a housing forming an enclosure having an edge seatable on a major surface of a printed circuit board, the enclosure edge including an edge portion configured to be positioned adjacent to at least a portion of a perimeter of a surface mount component that is mounted on the major surface of the printed circuit board and received in the enclosure, the housing being configured to position, in the enclosure, the surface mount component and to transfer a force to the surface mount component when the force is applied to the housing appropriate to press the edge portion against the portion of the perimeter of the surface mount component, whereby the surface mount component is dismounted from the printed circuit board when a sufficient such force is applied; and a dye inlet formed by the housing and configured to conduct a dye into the enclosure, and thereby onto the surface mount component when the housing edge is seated on the major surface of the printed circuit board with the surface mount component positioned within the enclosure.

2. The apparatus of claim 1, further comprising at least one gasket mounted to the enclosure edge to contact the major surface of the printed circuit board adjacent to the surface mount component such that a seal is formed when the gasket is pressed against the major surface of the printed circuit board.

3. The apparatus of claim 2, further comprising a vacuum inlet formed by the housing and configured to be connected to a vacuum pump to draw a vacuum in the enclosure.

4. The apparatus of claim 1, further comprising a heater mounted to the housing and configured to heat the enclosure.

5. The apparatus of claim 1, wherein the housing is made of aluminum.

6. The apparatus of claim 1, wherein the housing is configured to fit around the entire perimeter of the surface mount component.

7. An apparatus, comprising:

a housing forming an enclosure having an edge seatable on a major surface of a printed circuit board, the enclosure edge including an edge portion configured to be positioned adjacent to at least a portion of a perimeter of a surface mount component that is mounted on the major surface of the printed circuit board and received in the enclosure, the housing being configured to transfer a force to the surface mount component when the force is applied to the housing appropriate to press the edge portion against the portion of the perimeter of the surface mount component, whereby the surface mount component is dismounted from the printed circuit board when a sufficient such force is applied; and at least one gasket mounted to the enclosure edge to contact the major surface of the printed circuit board adjacent to the surface mount component and to enclose the surface mount component such that a seal is formed when the gasket is pressed against the major surface of the printed circuit board.

8. The apparatus of claim 7, further comprising a vacuum inlet formed by the housing and configured to be connected to a vacuum pump to draw a vacuum in the enclosure.

9. The apparatus of claim 8, further comprising a heater mounted to the housing and configured to heat the enclosure.

10. The apparatus of claim 9, further comprising a dye inlet formed by the housing and configured to conduct a dye into the enclosure, and thereby onto the surface mount component when the housing edge is seated on the major surface of the printed circuit board with the surface mount component positioned within the enclosure.

11. The apparatus of claim 10, wherein the housing is made of aluminum.

12. A method, comprising:

enclosing a surface mount component mounted on a major surface of a printed circuit board via a nozzle apparatus, the nozzle apparatus defining an enclosure with an opening, the surface mount component being received within the enclosure;

introducing a dye into the enclosure through a passage in the nozzle apparatus to apply the dye to the surface mount component while the surface mount component is enclosed; and applying a force to the nozzle apparatus in a direction parallel to the major surface of the printed circuit board while the surface mount component is enclosed, the force being sufficient to move the nozzle apparatus against the surface mount component and dismount the surface mount component from the printed circuit board.

13. The method of claim 12, further comprising forming a seal between an edge of the nozzle apparatus and the major surface of the printed circuit board around the surface mount component while the surface mount component is enclosed.

14. The method of claim 13, wherein forming a seal between an edge of the nozzle apparatus and the major surface of the printed circuit board around the surface mount component while the surface mount component is enclosed occurs subsequent to introducing a dye into the enclosure through a passage in the nozzle apparatus to apply the dye to the surface mount component while the surface mount component is enclosed.

15. The method of claim 13, further comprising evacuating the enclosure while the seal is formed between the edge and the major surface of the printed circuit board.

16. The method of claim 15, wherein evacuating the enclosure while the seal is formed between the edge and the major surface of the printed circuit board occurs subsequent to introducing a dye into the enclosure through a passage in the nozzle apparatus to apply the dye to the surface mount component while the surface mount component is enclosed.

17. The method of claim 12, further comprising heating the surface mount component via the nozzle apparatus while the surface mount component is enclosed.

18. The method of claim 17, wherein heating the surface mount component via the nozzle apparatus while the surface mount component is enclosed occurs subsequent to introducing a dye into the enclosure through a passage in the nozzle apparatus to apply the dye to the surface mount component while the surface mount component is enclosed.

19. The method of claim 12, wherein enclosing a surface mount component mounted on a major surface of a printed circuit board via a nozzle apparatus includes enclosing an entire perimeter of the surface mount component.

20. The method of claim 12, wherein introducing a dye into the enclosure through a passage in the nozzle apparatus to apply the dye to the surface mount component while the surface mount component is enclosed occurs prior to applying a force to the nozzle apparatus in a direction parallel to the major surface of the printed circuit board while the surface mount component is enclosed.

* * * * *